(12) United States Patent
Hashim et al.

(10) Patent No.: US 7,264,516 B2
(45) Date of Patent: Sep. 4, 2007

(54) COMMUNICATIONS JACK WITH PRINTED WIRING BOARD HAVING PAIRED COUPLING CONDUCTORS

(75) Inventors: Amid I. Hashim, Plano, TX (US); Bryan Moffitt, Red Bank, NJ (US); Julian Pharney, Indianapolis, IN (US)

(73) Assignee: CommScope, Inc., Hickory, NC (US)

( * ) Notice: Subject to any disclaimer, the term of this patent is extended or adjusted under 35 U.S.C. 154(b) by 0 days.

(21) Appl. No.: 11/231,175

(22) Filed: Sep. 20, 2005

(65) Prior Publication Data

US 2006/0121792 A1    Jun. 8, 2006

Related U.S. Application Data (60) Provisional application No. 60/648,002, filed on Jan. 28, 2005, provisional application No. 60/636,595, filed on Dec. 16, 2004, provisional application No. 60/636,590, filed on Dec. 16, 2004, provisional application No. 60/633,733, filed on Dec. 6, 2004.

(51) Int. Cl.
    *H01R 24/00* (2006.01)
(52) U.S. Cl. .................................. 439/676; 439/941
(58) Field of Classification Search ................ 439/676, 439/941
    See application file for complete search history.

(56) References Cited

U.S. PATENT DOCUMENTS

| 5,186,647 | A | 2/1993 | Denkmann et al. |
| 5,299,956 | A | 4/1994 | Brownell et al. |
| 5,310,363 | A | 5/1994 | Brownell et al. |
| 5,326,284 | A | 7/1994 | Bohbot et al. |
| 5,328,390 | A | 7/1994 | Johnston et al. |

(Continued)

FOREIGN PATENT DOCUMENTS

EP        0 525 703 B1    2/1993

(Continued)

OTHER PUBLICATIONS

International Search Report for PCT/US2005/041468; Date of Mailing Dec. 4, 2006.

(Continued)

*Primary Examiner*—Tho D. Ta
(74) *Attorney, Agent, or Firm*—Myers Bigel Sibley & Sajovec (57) ABSTRACT

A communications jack includes: a jack frame having a plug aperture; a plurality of contact wires, the contact wires having free ends that extend into the plug aperture, the free ends of the contact wires being arranged serially in side-by-side relationship; a plurality of electrical terminals, the terminals being arranged in pairs, each pair defining a communication channel; a dielectric mounting substrate, the mounting substrate including a plurality of mounting locations for contact wires and a plurality of mounting locations for the electrical terminals; and a plurality of conductors mounted on the substrate, each of the conductors extending, defining a path, and establishing electrical connection between a contact wire mounting location and an electrical terminal mounting location. First and second of the conductors that are connected to one of the pairs of terminals each include a coupling section, the coupling sections being immediately adjacent to each other and having identical instantaneous current direction such that the sections couple and cause a localized increase in inductance.

24 Claims, 5 Drawing Sheets

U.S. PATENT DOCUMENTS

| | | | |
|---|---|---|---|
| 5,362,257 A | | 11/1994 | Neal et al. |
| 5,397,862 A | | 3/1995 | Bockelman et al. |
| 5,414,393 A | | 5/1995 | Rose et al. |
| 5,432,484 A | | 7/1995 | Klas et al. |
| 5,459,643 A | * | 10/1995 | Siemon et al. .............. 361/785 |
| 5,547,405 A | | 8/1996 | Pinney et al. |
| 5,571,035 A | | 11/1996 | Ferrill |
| 5,587,884 A | | 12/1996 | Raman |
| 5,618,185 A | | 4/1997 | Aekins |
| 5,779,503 A | | 7/1998 | Tremblay et al. |
| 5,911,602 A | | 6/1999 | Vaden |
| 5,915,989 A | | 6/1999 | Adriaenssens et al. |
| 5,921,818 A | | 7/1999 | Larsen et al. |
| 5,947,772 A | | 9/1999 | Arnett et al. |
| 5,961,354 A | | 10/1999 | Hashim |
| 5,967,853 A | | 10/1999 | Hashim |
| 5,971,813 A | | 10/1999 | Kunz et al. |
| 5,975,919 A | | 11/1999 | Arnett et al. |
| 5,989,071 A | | 11/1999 | Larsen et al. |
| 5,997,358 A | | 12/1999 | Adriaenssens et al. |
| 6,017,247 A | | 1/2000 | Gwiazdowski |
| 6,042,427 A | | 3/2000 | Adriaenssens et al. |
| 6,050,843 A | | 4/2000 | Adriaenssens et al. |
| 6,102,730 A | | 8/2000 | Kjeidahl et al. |
| 6,116,964 A | | 9/2000 | Goodrich et al. |
| 6,120,330 A | | 9/2000 | Gwiazdowski |
| 6,165,023 A | | 12/2000 | Troutman et al. |
| 6,170,154 B1 | | 1/2001 | Swarup |
| 6,186,834 B1 | | 2/2001 | Arnett et al. |
| 6,196,880 B1 | | 3/2001 | Goodrich et al. |
| 6,238,235 B1 | | 5/2001 | Shavit et al. |
| 6,270,358 B1 | | 8/2001 | Nozick |
| 6,270,381 B1 | | 8/2001 | Adriaenssens |
| 6,312,290 B1 | | 11/2001 | Belopolsky |
| 6,350,158 B1 | | 2/2002 | Arnett et al. |
| 6,353,540 B1 | | 3/2002 | Narizuka et al. |
| 6,356,162 B1 | | 3/2002 | Deflandre et al. |
| 6,364,694 B1 | | 4/2002 | Lien |
| 6,379,157 B1 | | 4/2002 | Curry et al. |
| 6,379,198 B1 | | 4/2002 | Arnett et al. |
| 6,407,542 B1 | | 6/2002 | Conte |
| 6,428,362 B1 | | 8/2002 | Phommachanh |
| 6,443,776 B2 | | 9/2002 | Reichle |
| 6,443,777 B1 | | 9/2002 | McCurdy et al. |
| 6,464,529 B1 | | 10/2002 | Jensen et al. |
| 6,520,807 B2 | | 2/2003 | Winings |
| 6,524,128 B2 | | 2/2003 | Marowsky et al. |
| 6,530,810 B2 | | 3/2003 | Goodrich |
| 6,558,204 B1 | | 5/2003 | Weatherly |
| 6,558,207 B1 | | 5/2003 | Pepe et al. |
| 6,561,838 B1 | | 5/2003 | Blichfeldt |
| 6,592,395 B2 | | 7/2003 | Brown et al. |
| 6,764,348 B2 | | 7/2004 | Han et al. |
| 6,811,442 B1 | | 11/2004 | Lien et al. |
| 6,840,816 B2 | * | 1/2005 | Aekins ....................... 439/676 |
| 6,962,503 B2 | | 11/2005 | Aekins |
| 2001/0018287 A1 | | 8/2001 | Reichie |
| 2001/0021608 A1 | | 9/2001 | Borbolla et al. |
| 2001/0048592 A1 | | 12/2001 | Nimomiya |
| 2002/0088977 A1 | | 7/2002 | Mori et al. |
| 2003/0129880 A1 | | 7/2003 | Arnett et al. |
| 2004/0002267 A1 | | 1/2004 | Hatterscheid et al. |
| 2006/0121788 A1 | | 6/2006 | Pharney |
| 2006/0121789 A1 | | 6/2006 | Hashim |
| 2006/0160428 A1 | | 7/2006 | Hashim |

FOREIGN PATENT DOCUMENTS

| | | |
|---|---|---|
| EP | 0 901 201 | 3/1999 |
| EP | 1 059 704 | 12/2000 |
| EP | 1 191 646 | 3/2002 |
| EP | 1 435 679 | 7/2004 |
| WO | WO94/05092 | 3/1994 |
| WO | WO99/53574 | 10/1999 |
| WO | WO 03-019734 | 3/2003 |
| WO | WO 03/090322 | 10/2003 |

OTHER PUBLICATIONS

U.S. Appl. No. 10/845,104, filed May 14, 2004, Hashim.

International Search Report and Written Opinion of the International Searching Authority for PCT Application No. PCT/US2005/039586; Date of mailing Mar. 7, 2006.

* cited by examiner

COMMUNICATIONS JACK WITH PRINTED WIRING BOARD HAVING PAIRED COUPLING CONDUCTORS

RELATED APPLICATIONS

The present application claims priority from U.S. Provisional Patent Application Ser. Nos. 60/633,733, filed Dec. 6, 2004, entitled COMMUNICATION PLUG WITH BALANCED WIRING TO MINIMIZE DIFFERENTIAL TO COMMON MODE CROSSTALK, 60/636,590, filed Dec. 16, 2004, entitled IMPROVING RETURN LOSS IN CONNECTORS BY CONDUCTOR SELF-COUPLING, 60/636,595, filed Dec. 16, 2004, entitled CROSSOVER FOR SIMULTANEOUSLY COMPENSATING DIFFERENTIAL TO DIFFERENTIAL OR DIFFERENTIAL TO COMMON MODE CROSSTALK, and 60/648,002, filed Jan. 28, 2005, entitled CONTROLLED MODE CONVERSION PLUG FOR REDUCED ALIEN CROSSTALK, and from U.S. patent application Ser. No. 11/051,285, filed Feb. 4, 2005, entitled COMMUNICATION JACK WITH PRINTED WIRING BOARD HAVING SELF-COUPLING CONDUCTOR, the disclosure of each of which is hereby incorporated herein in its entirety.

FIELD OF THE INVENTION

The present invention relates generally to communication connectors and more particularly to the improvement of return loss in high frequency communication connectors.

BACKGROUND OF THE INVENTION

In an electrical communication system, it is sometimes advantageous to transmit information signals (video, audio, data) over a pair of wires (hereinafter "wire-pair" or "differential pair") rather than a single wire, wherein the transmitted signal comprises the voltage difference between the wires without regard to the absolute voltages present. Each wire in a wire-pair is susceptible to picking up electrical noise from sources such as lightning, automobile spark plugs and radio stations to name but a few. Because this type of noise is common to both wires within a pair, the differential signal is typically not disturbed. This is a fundamental reason for having closely spaced differential pairs.

Of greater concern, however, is the electrical noise that is picked up from nearby wires or pairs of wires that may extend in the same general direction for some distances and not cancel differentially on the victim pair. This is referred to as crosstalk. Particularly, in a communication system involving networked computers, channels are formed by cascading plugs, jacks and cable segments. In such channels, a modular plug often mates with a modular jack, and the routing of the electrical wires (conductors) within the jack and/or plug also can produce near-end crosstalk (NEXT) (i.e., the crosstalk measured at an input location corresponding to a source at the same location). This crosstalk occurs from closely-positioned wires over a short distance. In all of the above situations, undesirable signals are present on the electrical conductors that can interfere with the information signal. As long as the same noise signal is added to each wire in the wire-pair, the voltage difference between the wires will remain about the same and differential cross-talk does not exist.

U.S. Pat. No. 5,997,358 to Adriaenssens et al. (hereinafter "the '358 patent") describes a two-stage scheme for compensating differential to differential NEXT for a plug-jack combination (the entire contents of the '358 patent are hereby incorporated herein by reference, as are U.S. Pat. Nos. 5,915,989; 6,042,427; 6,050,843; and 6,270,381). Connectors described in the '358 patent can reduce the internal NEXT (original crosstalk) between the electrical wire pairs of a modular plug by adding a fabricated or artificial crosstalk, usually in the jack, at one or more stages, thereby canceling or reducing the overall crosstalk for the plug-jack combination. The fabricated crosstalk is referred to herein as a compensation crosstalk. This idea can often be implemented by twice crossing the path of one of the differential pairs within the connector relative to the path of another differential pair within the connector, thereby providing two stages of NEXT compensation. This scheme can be more efficient at reducing the NEXT than a scheme in which the compensation is added at a single stage, especially when the second and subsequent stages of compensation include a time delay that is selected to account for differences in phase between the offending and compensating crosstalk. This type of arrangement can include capacitive and/or inductive elements that introduce multi-stage crosstalk compensation, and is typically employed in jack lead frames and PWB structures within jacks. These configurations can allow connectors to meet "Category 6" performance standards set forth in ANSI/EIA/TIA 568, which are primary component standards for mated plugs and jacks for transmission frequencies up to 250 MHz.

Unfortunately, the introduction of compensatory crosstalk can negatively impact other electrical properties. For example, "return loss" measures the degree to which the input impedance of a plug-jack combination or an unshielded twisted wire pair (UTP) matches 100 ohms. Achieving acceptable return loss performance, particularly on conductor pairs 1 and 3 (as designated in TIA 568B) of an eight conductor jack, can be especially challenging due to the heavy crosstalk compensation typically required by these two pairs. Pair 1 return loss can be further aggravated by high capacitance shunting resulting from the close proximity of its two contact blades (i.e., its "tip" and "ring") in a plug. Reaching an acceptable compromise between crosstalk compensation and return loss can be exceptionally challenging for plugs that are to meet or exceed Category 6 performance parameters, particularly if data transmission speeds of 10 Gb/s over UTP are desired over a frequency range of 1-500 MHz.

SUMMARY OF THE INVENTION

The present invention can address some of the issues raised by prior art connectors. As a first aspect, embodiments of the present invention are directed to a wiring board for a communications jack, comprising: a dielectric mounting substrate, the mounting substrate including a plurality of mounting locations for contact wires and a plurality of mounting locations for output terminals; and a plurality of conductors mounted on the substrate, each of the conductors extending, defining a path, and establishing electrical connection between a contact wire mounting location and an output terminal mounting location, the output terminal mounting locations being arranged in pairs, each pair representing a communication channel. Each of the conductors connected with a first output terminal mounting location pair includes a coupling section, the coupling sections being immediately adjacent to each other and having identical instantaneous current direction such that the sections couple and cause a localized increase in inductance.

As a second aspect, embodiments of the present invention are directed to a communications jack, comprising: a jack frame having a plug aperture; a plurality of contact wires, the contact wires having free ends that extend into the plug aperture, the free ends of the contact wires being arranged serially in side-by-side relationship; a plurality of electrical terminals, the terminals being arranged in pairs, each pair defining a communication channel; a dielectric mounting substrate, the mounting substrate including a plurality of mounting locations for contact wires and a plurality of mounting locations for the electrical terminals; and a plurality of conductors mounted on the substrate, each of the conductors extending, defining a path, and establishing electrical connection between a contact wire mounting location and an electrical terminal mounting location. First and second of the conductors that are connected to one of the pairs of terminals each include a coupling section, the coupling sections being immediately adjacent to each other and having identical instantaneous current direction such that the sections couple and cause a localized increase in inductance.

As a third aspect, embodiments of the present invention are directed to a communications connector, comprising: a mounting substrate; a plurality of conductors mounted on the mounting substrate; a plurality of electrical terminals arranged in pairs, each electrically connected to a respective one of the plurality of conductors; and a plurality of contacts, each electrically connected to a respective one of the plurality of conductors. Each of the conductors connected with a first pair of terminals is configured such that it includes two coupling sections that are immediately adjacent to each other and that have identical instantaneous current direction such that the sections couple and cause a localized increase in inductance.

As a fourth aspect, embodiments of the present invention are directed to a method of increasing return loss in a communications connector, the connector comprising a wiring board and a plurality of conductors mounted thereon, the conductors being electrically connected with electrical terminals that are arranged in pairs. The method comprises the step of coupling sections of two of the conductors electrically connected with a pair of electrical terminals, the sections being immediately adjacent to each other and having identical instantaneous current direction, such that the sections couple and cause a localized increase in inductance.

As a fifth aspect, embodiments of the present invention are directed to a method of increasing localized inductance in a conductor of a communications connector, the connector comprising a wiring board and a plurality of conductors mounted thereon, the conductors being electrically connected with electrical terminals that are arranged in pairs. The method comprises the step of coupling sections of two of the conductors electrically connected with a pair of electrical terminals, the sections being immediately adjacent to each other and that having identical instantaneous current direction, such that the sections couple and cause a localized increase in inductance.

DETAILED DESCRIPTION OF EMBODIMENTS OF THE INVENTION

The present invention will be described more particularly hereinafter with reference to the accompanying drawings. The invention is not intended to be limited to the illustrated embodiments; rather, these embodiments are intended to fully and completely disclose the invention to those skilled in this art. In the drawings, like numbers refer to like elements throughout. Thicknesses and dimensions of some components may be exaggerated for clarity.

Unless otherwise defined, all technical and scientific terms used herein have the same meaning as commonly understood by one of ordinary skill in the art to which this invention belongs. The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise. As used herein, the term "and/or" includes any and all combinations of one or more of the associated listed items. Where used, the terms "attached", "connected", "interconnected", "contacting", "mounted" and the like can mean either direct or indirect attachment or contact between elements, unless stated otherwise. Also, where used, the terms "coupled", "induced" and the like can mean nonconductive electrical interaction, either direct or indirect, between elements or different sections of the same element, unless otherwise stated. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In addition, spatially relative terms, such as "under", "below", "lower", "over", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is inverted, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly.

Figure 1:
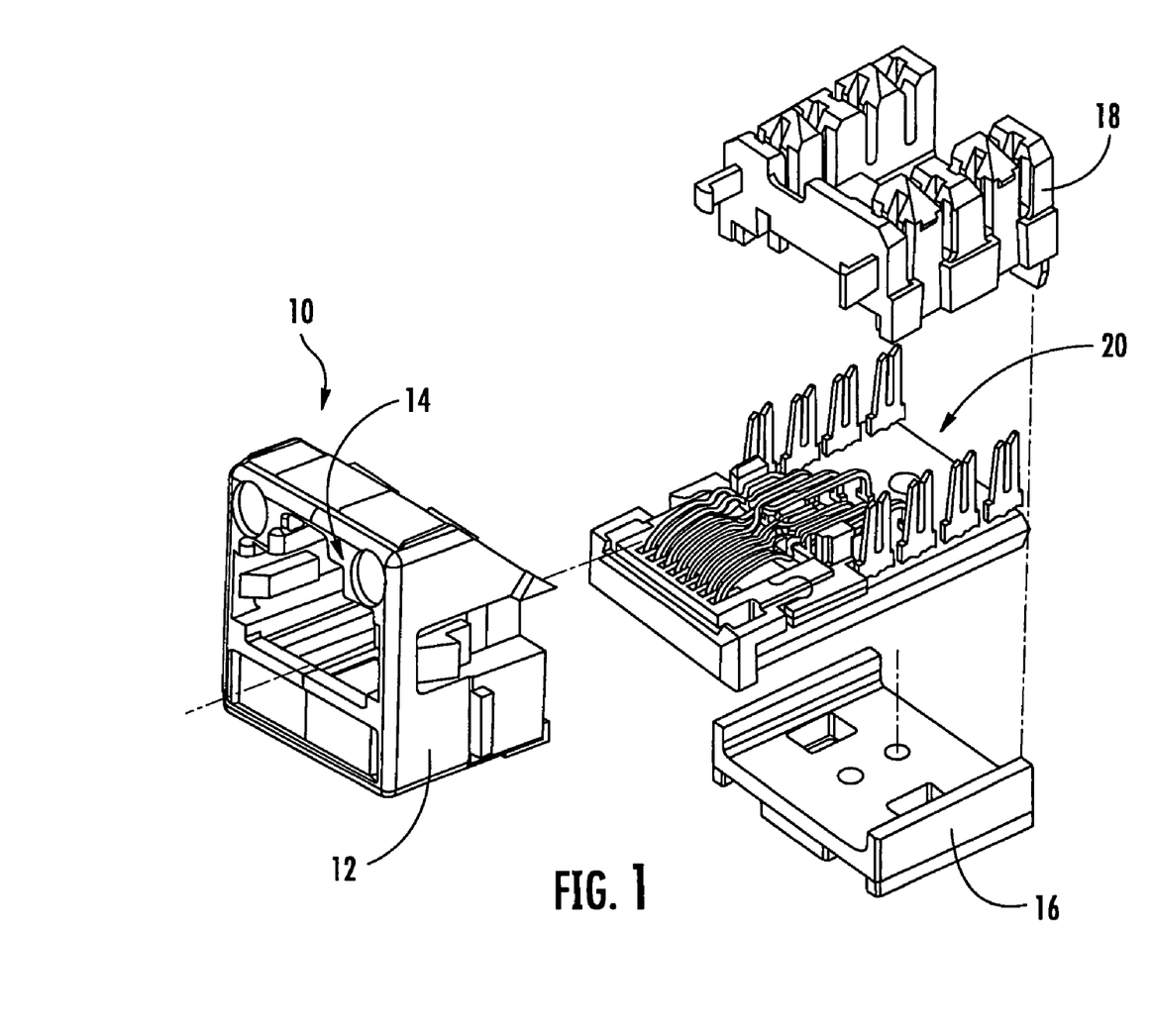
FIG. 1 is an exploded perspective view of a communications jack according to embodiments of the present invention.

Referring now to the figures, an exemplary communications jack, designated broadly at 10, is illustrated in FIG. 1. The illustrated jack 10 is of the configuration known in this art as an RJ11- or RJ45-style jack. The jack 10 includes a jack frame 12 having a plug aperture 14 for receiving a mating plug (not shown—exemplary plugs are illustrated in U.S. Pat. No. 6,250,949 to Lin and in co-pending and co-assigned U.S. patent application Ser. No. 11/051,305, filed Feb. 4, 2005 and entitled COMMUNICATION PLUG WITH BALANCED WIRING TO REDUCE DIFFERENTIAL TO COMMON MODE CROSSTALK, a cover 16 and a terminal housing 18. These components are conventionally formed and not need be described in detail herein; for a further description of these components and the manner in which they interconnect, see U.S. Pat. No. 6,350,158 to Arnett et al., the disclosure of which is hereby incorporated herein in its entirety. Those skilled in this art will recognize that other configurations of jack frames, covers and terminal housings may also be employed with the present invention. Exemplary configurations are illustrated in U.S. Pat. Nos. 5,975,919 and 5,947,772 to Arnett et al. and U.S. Pat. No. 6,464,541 to Hashim et al., the disclosure of each of which is hereby incorporated herein in its entirety.

Figure 1A:
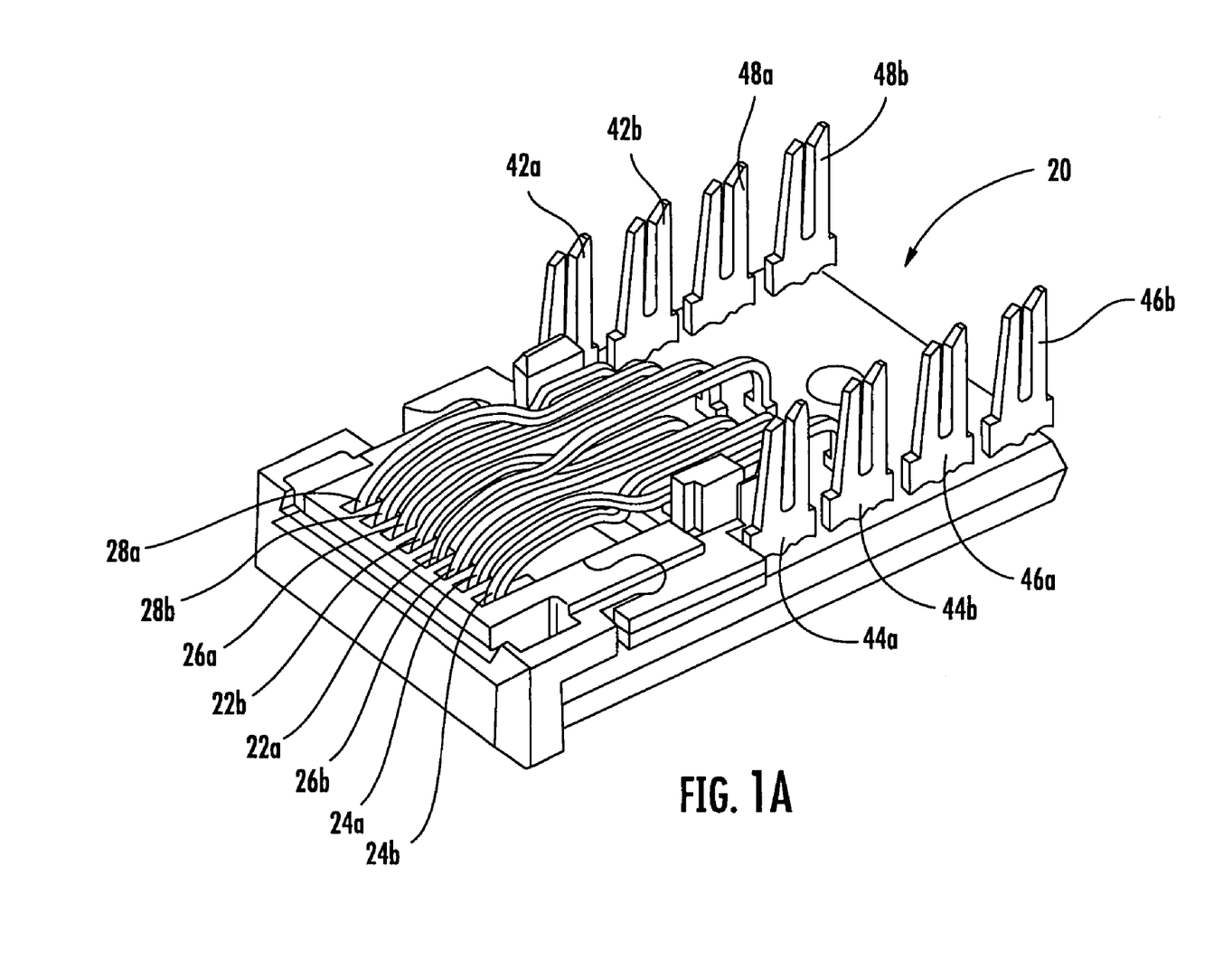
FIG. 1A is an enlarged perspective view of a wiring board of the communications jack of FIG. 1.
Figure 2:
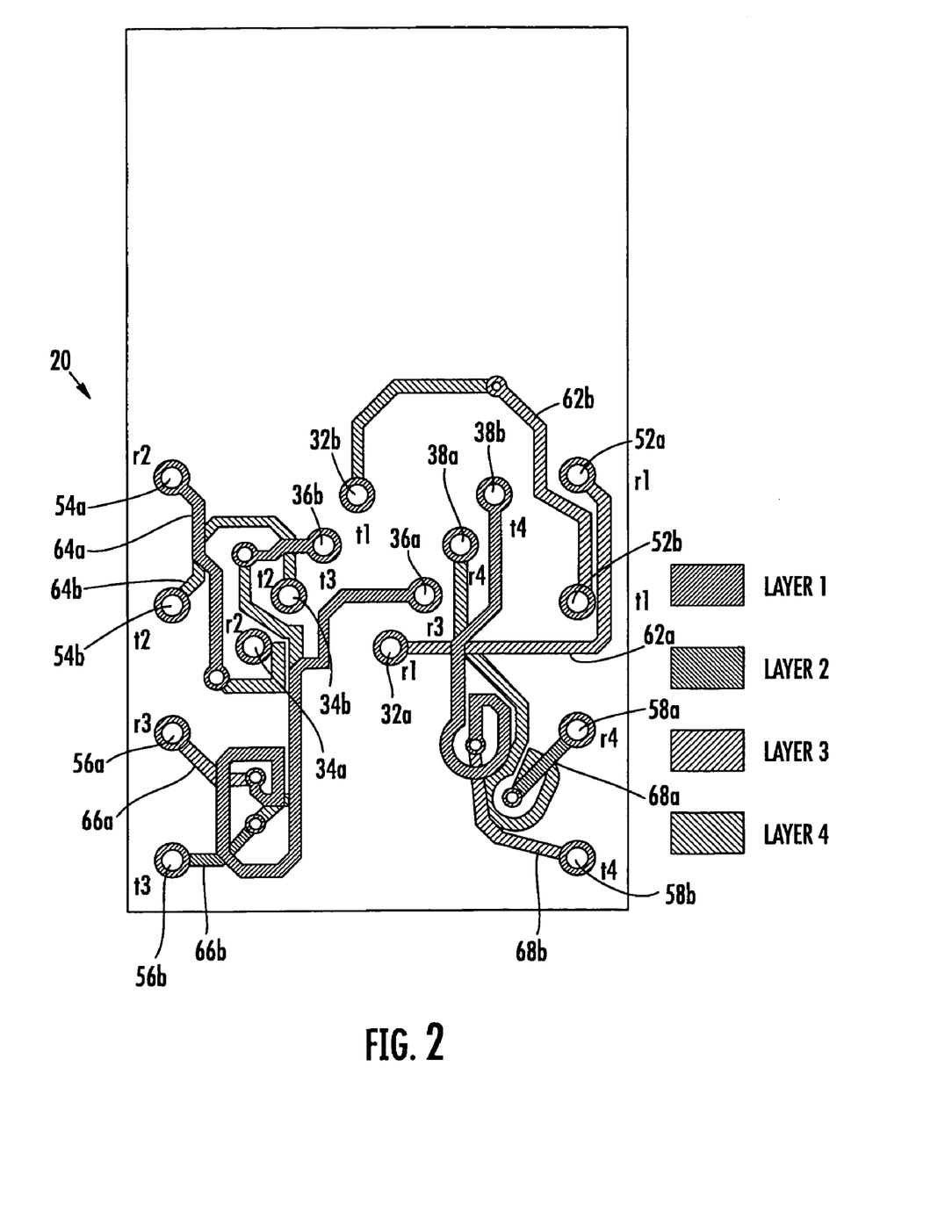
FIG. 2 is a schematic plan view of a wiring board of the jack of FIG. 1, with conductors residing on different layers of the wiring board being shown in different shading and/or cross-hatching.

Referring still to FIG. 1 and also to FIGS. 1A and 2, the jack 10 further includes a wiring board 20 formed of conventional materials. The wiring board 20 may be a single layer board or, as illustrated, may have multiple layers. The wiring board 20 may be substantially planar as illustrated, or may be non-planar.

Contact wires 22a, 22b, 24a, 24b, 26a, 26b, 28a, 28b are attached to the wiring board 20. As described in U.S. Pat. No. 6,350,158 referenced above, the contact wires 22a, 22b, 24a, 24b, 26a, 26b, 28a, 28b have free ends that are disposed generally parallel to each other and that extend into the plug aperture 14 of jack frame 12 to form electrical contact with the terminal blades of a mating plug. The contact wires 22a, 22b, 24a, 24b, 26a, 26b, 28a, 28b are arranged in pairs defined by TIA 568B, with wires 22a, 22b (pair 1) being adjacent to each other and in the center of the sequence of wires, wires 24a, 24b (pair 2) being adjacent to each other and occupying the leftmost two positions (from the vantage point looking from the rear of the jack 10 toward a mating plug in the plug aperture 14) in the sequence, wires 28a, 28b (pair 4) being adjacent to each other and occupying the rightmost two positions (again, from the same vantage point as just discussed above) in the sequence, and wires 26a, 26b (pair 3) being positioned between, respectively, pairs 1 and 4 and pairs 1 and 2. The wires 22a, 22b, 24a, 24b, 26a, 26b, 28a, 28b are mounted to the wiring board 20 via insertion into respective apertures 32a, 32b, 34a, 34b, 36a, 36b, 38a, 38b, which are arranged in the illustrated embodiment in a "dual diagonal" pattern as described in U.S. Pat. No. 6,196,880 to Goodrich et al., the disclosure of which is hereby incorporated herein in its entirety. In the illustrated embodiment, the wires 22a, 22b, 24a, 24b, 28a, 28b of pairs 1, 2 and 4 each include a "crossover", in which the wires of the pair cross each other on a non-contacting fashion between their free and fixed ends.

Those skilled in this art will appreciate that contact wires or other contacts of other configurations may be used. As one example, contact wires configured as described in aforementioned U.S. Pat. No. 5,975,919 to Arnett et al. may be employed. As another example, other crossover arrangements may be employed, including those in which only the pair 3 wires include a crossover (see, e.g., co-assigned and co-pending U.S. patent application Ser. No. 11/044,088, filed Mar. 23, 2005), and those in which pair 3 includes two or more crossovers and pairs 1, 2 and 4 include a crossover (see, e.g., U.S. patent application Ser. No. 11/208,980, filed Aug. 22, 2005 and entitled Communications Connector for Imparting Crosstalk Compensation Between Conductors, the disclosures of each of which are hereby incorporated herein in their entireties. Moreover, crossover techniques for the contact wires such as those illustrated and described in co-pending and co-assigned U.S. patent application Ser. No. 11/139,768, filed May 27, 2005 may also be employed. The skilled artisan will recognize other suitable alternative configurations. Also, the contact wires may mount on the wiring board in a different configuration, such as the staggered configuration described and illustrated in U.S. patent application Ser. No. 11/208,980, filed Aug. 22, 2005, entitled Communications Connector for Imparting Crosstalk Compensation Between Conductors.

Eight insulation displacement connectors (IDCs) 42a, 42b, 44a, 44b, 46a, 46b, 48a, 48b are inserted into eight respective IDC apertures 52a, 52b, 54a, 54b, 56a, 56b, 58a, 58b. The IDCs may be of conventional construction and need not be described in detail herein; exemplary IDCs are illustrated and described in aforementioned U.S. Pat. No. 5,975,919 to Arnett. Connectors other than IDCs may also be employed.

Referring now to FIG. 2, the each of the wire apertures 32a, 32b, 34a, 34b, 36a, 36b, 38a, 38b is electrically connected to a respective IDC aperture 52a, 52b, 54a, 54b, 56a, 56b, 58a, 58b via a respective conductor 62a, 62b, 64a, 64b, 66a, 66b, 68a, 68b, thereby interconnecting each of the contact wires 22a, 22b, 24a, 24b, 26a, 26b, 28a, 28b to its corresponding IDC 42a, 42b, 44a, 44b, 46a, 46b, 48a, 48b. The conductors 62a, 62b, 64a, 64b, 66a, 66b, 68a, 68b are formed of conventional conductive materials and are deposited on the wiring board 20 via any deposition method known to those skilled in this art to be suitable for the application of conductors. Some conductors are illustrated as being entirely present on a single layer of the wiring board 20 (for example, conductor 62a), while other conductors (for example, conductor 62b) may reside on multiple layers of the wiring board 20; conductors can travel between layers through the inclusion of vias (also known as plated through holes) or other layer-transferring structures known to those skilled in this art.

Figure 3:
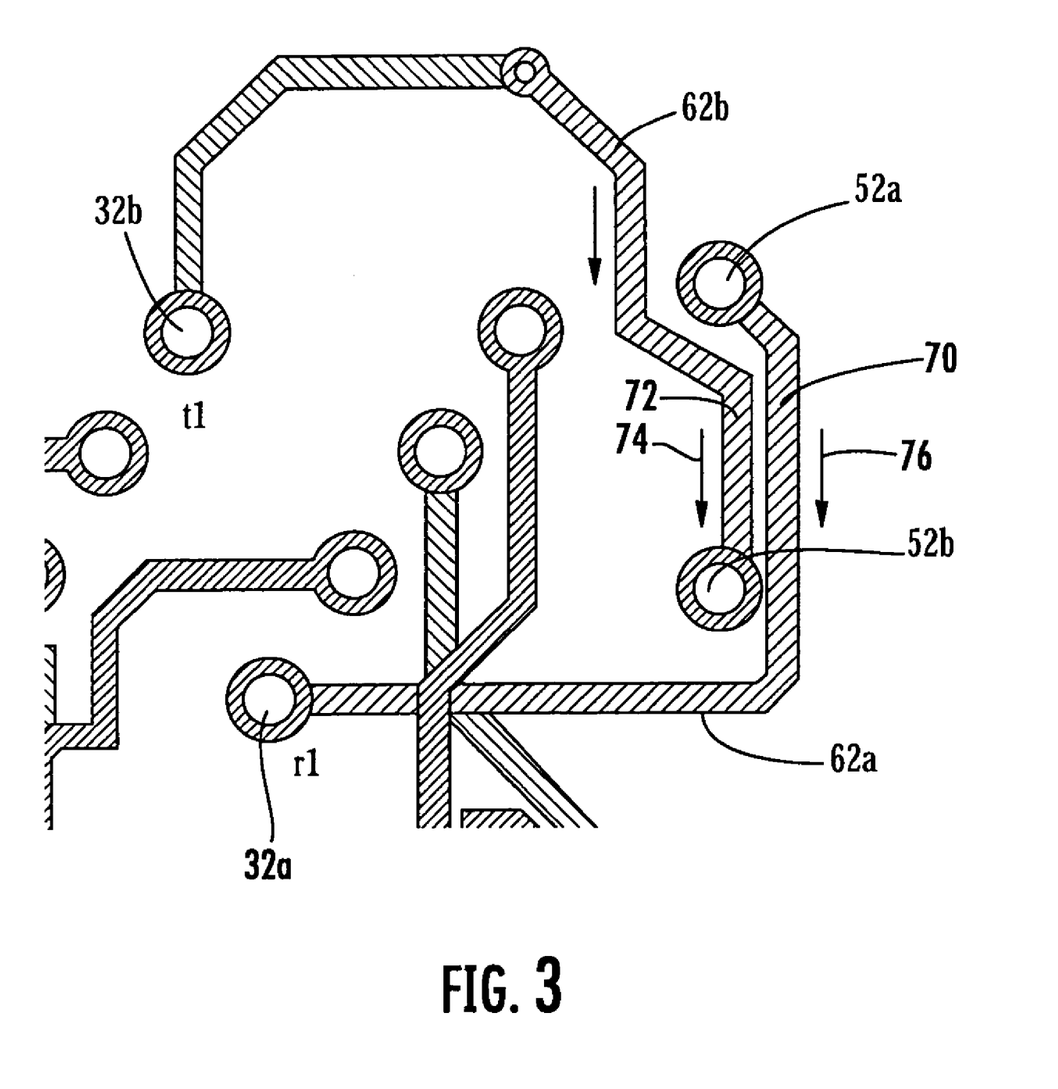
FIG. 3 is an enlarged plan view of a conductor pair of the wiring board of FIG. 2.

Referring now to FIG. 3, it can be seen that conductor 62a, which connects contact wire 22a to IDC 42a (i.e., it connects the "ring" of pair 1), and conductor 62b, which connects contact wire 22b to IDC 42b (thereby connecting the "tip" of pair 1), include respective sections 70, 72 that are immediately adjacent each other and that, in this embodiment, follow substantially parallel paths. It can also be seen via the arrows 74, 76 that the polarity of the instantaneous current (and, thus the signal) of the sections 70, 72 is the same. The immediate adjacency of this arrangement results in coupling between the sections 70 and 72 of the conductors 62a, 62b, thus causing an increase in localized inductance.

It has been determined that judicious selection of the sites where portions of a conductor are positioned immediately adjacent to each other, in the above-described manner, can control the input impedance, and in turn the return loss, of a mated plug-jack combination. As such, the jack 10 can withstand the increased crosstalk compensation that may be necessary to achieve, in a mated plug-jack combination, elevated frequency signal transmission while still experiencing acceptable levels of return loss. Typically, the two coupling sections of the conductors that comprise pair 1 are immediately adjacent to each other for a distance of between about 0.05 and 0.2 inches, although this distance may vary. The gap between the immediately adjacent sections may be between about 5 to 20 mils; in some embodiments, a minimum gap between adjacent conductors of at least 8 mils is preferred. In a typical jack, causing an increase of between about 2 to 8 nanohenries in localized inductance in pair 1 can provide the desired improvement in return loss (the expected level of inductance can be calculated using, for example, equations set forth in H. Greenhouse, Design of Planar Rectangular Microelectric Inductors, IEEE Transactions on Parts, Hybrids, and Packaging, Vol. PHP-10, No. 2 (June 1974) at page 103).

This concept may be applied in conjunction with self-coupling segments within the same conductor to reduce return loss, as described in co-assigned and co-pending U.S. patent application Ser. No. 11/051,285, filed Feb. 4, 2005, the disclosure of which is hereby incorporated herein in its entirety.

Typically, and as illustrated, the inclusion of coupling sections in the two conductors that comprise pair 1 is sufficient for improving the return loss performance of those pairs; however, this concept can be applied to other pairs of conductors, such as to any or all of pairs 2, 3 and 4, or to other conductors of jacks that employ different numbers of conductors (e.g., a sixteen conductor jack). Also, although in the illustrated embodiment both of the coupling conductors of a wire pair are mounted on the same layer of the wire board, this need not be the case; one or more layers of a wire board may separate the coupling sections of the conductors. Moreover, the skilled artisan will recognize that many different conductor paths that utilize the concepts of the present invention may be employed.

Those skilled in this art will recognize that embodiments of the wiring board described above may be employed in other environments in which a communications jack may be found. For example, jacks within a patch panel or series of patch panels may be suitable for use with such wiring boards. Other environments may also be possible.

Those skilled in this art will further recognize that the conductor coupling sections described above can be implemented, with similar beneficial effect on return loss, by forming the conductor leads of jacks utilizing metallic leadframe structures instead of printed wiring boards to achieve the required connectivity and crosstalk compensation. In such a configuration, the contact wires and/or the insulation displacement connectors may be formed integrally with the conductors as unitary members.

The invention will now be described in greater detail in the following non-limiting example.

EXAMPLE

Communications jacks of the configuration illustrated in FIG. 1 were constructed. In one set of jacks (labeled "experimental jacks" in FIG. 4), the wiring board included conductors of pair 1 that had coupling sections substantially matching those illustrated in FIGS. 2 and 3. In a second set of jacks (labeled "conventional jacks" in FIG. 4), the wiring board included conductors that did not have such coupling sections. The jacks were then tested for return loss on pair 1 under the conditions set forth in TIA/EIA-568-B.2-1 Annex E.

Figure 4:
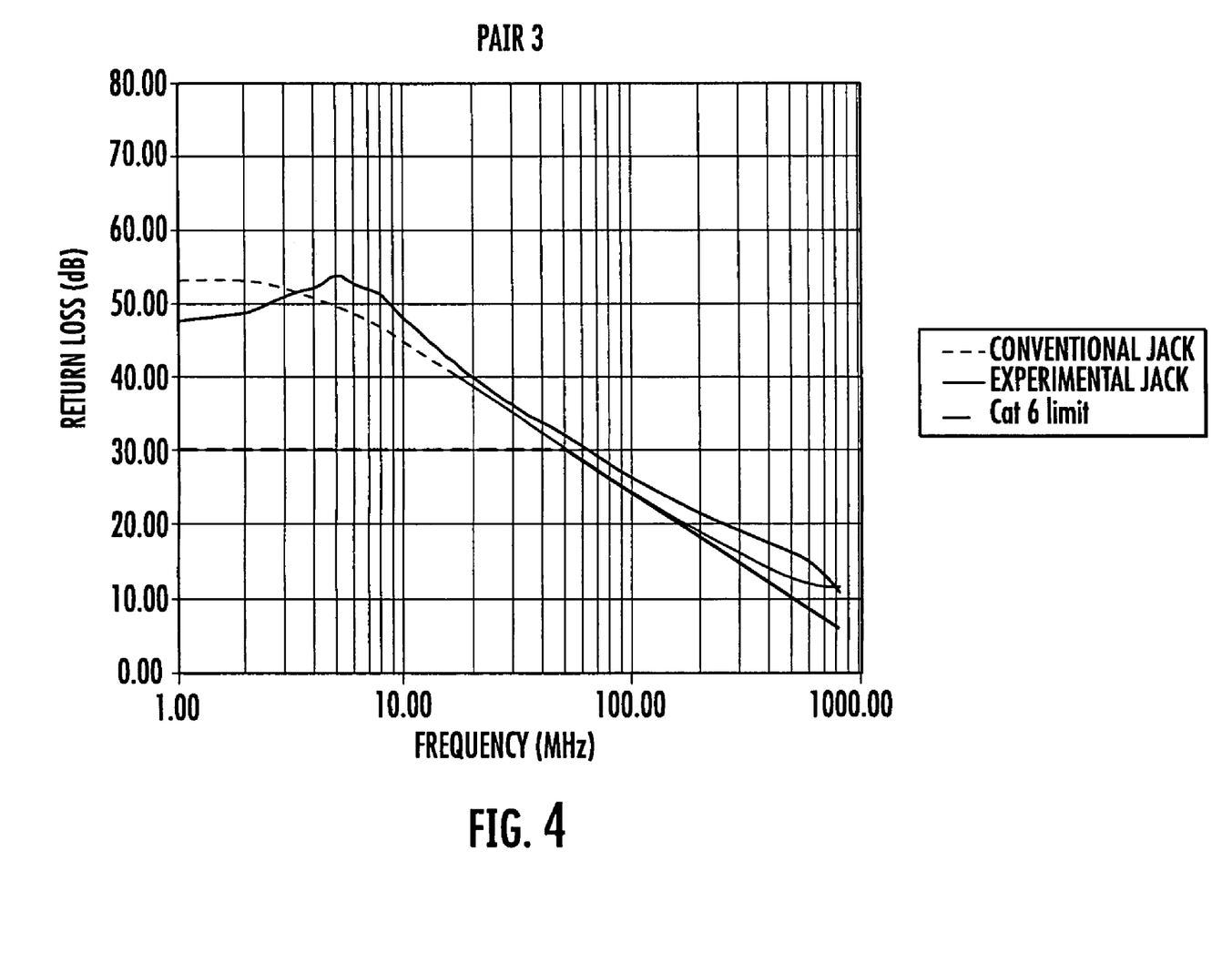
FIG. 4 is a graph plotting return loss as a function of frequency for conventional and experimental jacks.

Results of the testing are shown in FIG. 4. It can be seen that the experimental jack employing the coupling sections exhibited a significant increase in the return loss decibel level (i.e., an improvement) over the conventional jack, at frequencies above about 2.5 MHz.

The foregoing is illustrative of the present invention and is not to be construed as limiting thereof. Although exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. The invention is defined by the following claims, with equivalents of the claims to be included therein.

That which is claimed is:

1. A communications connector, comprising:
a first conductive path electrically connecting a first input of the connector and a first output of the connector;
a second conductive path electrically connecting a second input of the connector and a second output of the connector, wherein the first and second conductive paths comprise a first differential pair of conductive paths for transmitting a first information signal;
a third conductive path electrically connecting a third input of the connector and a third output of the connector; and
a fourth conductive path electrically connecting a fourth input of the connector and a fourth output of the connector, wherein the third and fourth conductive paths comprise a second differential pair of conductive paths for transmitting a second information signal,
wherein a first section of the first conductive path is immediately adjacent to a first section of the second conductive path that has the same instantaneous current direction as the first section of the first conductive path, and
wherein a first section of the third conductive path is immediately adjacent to a first section of the fourth conductive path that has the same instantaneous current direction as the first section of the third conductive path.

2. The connector defined in claim 1 wherein the first section of the first conductive path and the first section of the second conductive path are arranged with respect to each other so as to cause a localized increase in inductance in order to cause an increase in return loss of at least about 3 dB above 100 MHz.

3. The connector defined in claim 2, wherein the localized increase in inductance is between about 2 to about 8 nanohenries.

4. The connector defined in claim 2, wherein the localized increase in inductance is selected to provide an input impedance of approximately 100 ohms on the first differential pair of conductive paths.

5. The connector defined in claim 2, wherein an amount of the localized increase in inductance is selected based at least in part on the amount of improvement the localized increase in inductance provides in the return loss associated with the first differential pair of conductive paths.

6. The connector defined in claim 1, wherein the first input and the second input are directly adjacent to each other.

7. The connector defined in claim 6, wherein the first input and the second input are between the third input and the fourth input.

8. The connector defined in claim 7, the connector further comprising a wiring board having a dielectric mounting substrate, wherein the first section of the first conductive path comprises a first conductive trace on the dielectric mounting substrate and wherein the first section of the second conductive path comprises a second conductive trace on the dielectric mounting substrate.

9. The connector defined in claim 7, wherein the first section of the first conductive path and the first section of the second conductive path travel immediately adjacent to each other for about 0.05 to about 0.20 inches.

10. The connector defined in claim 9, the connector further comprising a dielectric mounting substrate having first and second contact wire mounting locations and first and second output terminal mounting locations, wherein the first conductive path comprises one or more first conductive traces on the dielectric mounting substrate electrically connecting the first contact wire mounting location to the first output terminal mounting location, and wherein the second conductive path comprises one or more second conductive traces on the dielectric mounting substrate electrically connecting the second contact wire mounting location to the second output terminal mounting location.

11. The connector defined in claim 9, wherein a gap between the first section of the first conductive path and the first section of the second conductive path is between about 8 and about 15 mils.

12. The connector defined in claim 11, wherein the first section of the first conductive path and the first section of the second conductive path are substantially parallel to each other.

13. The connector defined in claim 11, wherein the first section of the first conductive path and the first section of the second conductive path are adjacent at least one of the first output or the second output.

14. A method of increasing localized inductance in a conductor of a communications connector, the connector comprising a plurality of conductors, the conductors being electrically connected with electrical terminals that are arranged in pairs, the method comprising
coupling sections of two of the conductors that are electrically connected with a pair of electrical terminals, the coupling sections comprise a differential pair and the coupling sections being immediately adjacent to each other and having the same instantaneous current direction; and
selecting the portions of the two conductors that travel immediately adjacent to each other in order to provide a pre-selected improvement in a return loss of the two conductors.

15. The method of claim 14, further comprising coupling sections of another two of the conductors that are electrically connected with another pair of electrical terminals, the coupling sections of the another two of the conductors being immediately adjacent to each other and having the same instantaneous current direction.

16. A method of improving the return loss performance of a communications connector, the connector comprising at least first and second conductive paths that together comprise at least part of a first differential communication channel and third and fourth conductive paths that together comprise at least part of a second differential communication channel, the method comprising:
locating a section of the first conductive path immediately adjacent a section of the second conductive path, wherein the sections of the first and second conductive paths have the same instantaneous current direction; and
locating a section of the third conductive path immediately adjacent a section of the fourth conductive path, wherein the sections of the third and fourth conductive paths have the same instantaneous current direction.

17. A communications connector, comprising:
a plurality of contact wires:
a plurality of electrical terminals, the terminals being arranged in pairs, each pair defining a communication channel;
a dielectric mounting substrate, the mounting substrate including a plurality of mounting locations for respective ones of the contact wires and a plurality of mounting locations for respective ones of the electrical terminals;
a plurality of conductors mounted on the dielectric mounting substrate, each of the conductors establishing electrical connection between a contact wire mounting location and an electrical terminal mounting location;
wherein first and second of the conductors that comprise a first differential pair of conductors and that are electrically connected to a first of the pairs of electrical terminals each includes a coupling section, the coupling sections being immediately adjacent to each other and having identical instantaneous current direction in order to cause an increase in return loss of at least about 3 dB above 100 MHz on the first differential pair of conductors;
wherein third and fourth of the conductors that comprise a second differential pair of conductors and that are electrically connected to a second of the pairs of electrical terminals each includes a coupling section, the coupling sections being immediately adjacent to each other and having identical instantaneous current direction in order to cause an increase in return loss of at least about 3 dB above 100 MHz on the second differential pair of conductors.

18. The connector defined in claim 17, wherein the coupling sections of the first and second of the conductors are arranged to cause a localized increase in inductance that is selected based at least in part on the amount of improvement the localized increase in inductance provides in the return loss on the first differential pair of conductors.

19. The connector defined in claim 18, wherein the localized increase in inductance is between about 2 to about 8 nanohenries.

20. The connector defined in claim 18, wherein the localized increase in inductance is selected to provide an input impedance of approximately 100 ohms on the first differential pair of conductors.

21. The connector defined in claim 18, wherein the coupling sections travel immediately adjacent to each other for about 0.05 to about 0.20 inches.

22. The connector defined in claim 18, wherein a gap between the coupling sections of the first and second of the conductors path is between about 8 and about 15 mils.

23. A communications connector, comprising:
a dielectric mounting substrate that includes first and second contact wire mounting locations and first and second electrical terminal mounting locations;
a first contact wire mounted in the first contact wire mounting location and a second contact wire mounted in the second contact wire mounting location;
a first electrical terminal and a second electrical terminal that define a first differential pair;
a first conductive path electrically connecting the first contact wire mounting location to the first electrical terminal mounting location;
a second conductive path electrically connecting the second contact wire mounting location to the second electrical terminal mounting location;
wherein the second electrical terminal mounting location is completely encircled by a closed loop that is defined by at least part of the first conductive path and a straight line that extends between the first contact wire mounting location and the first electrical terminal mounting location; and
wherein a first segment of the first conductive path and a first segment of the second conductive path are immediately adjacent to each other and have the same instantaneous current direction.

24. The connector of claim 16, wherein the first segments of the first and second conductive paths are arranged with respect to each other to provide a pre-selected improvement in the return loss of the first differential pair.

* * * * *

UNITED STATES PATENT AND TRADEMARK OFFICE
CERTIFICATE OF CORRECTION

PATENT NO.         : 7,264,516 B2                                           Page 1 of 1
APPLICATION NO.    : 11/231175
DATED              : September 4, 2007
INVENTOR(S)        : Hashim et al.

It is certified that error appears in the above-identified patent and that said Letters Patent is hereby corrected as shown below:

On Title Page:
Item (60) Related U.S. Application Data: Please correct to read
--Provisional application No. 60/636,590, filed on Dec. 16, 2004, U.S. Patent No. 11/051,285, filed February 4, 2005.--

In the Specification:
Column 1, Lines 7-24 (i.e., the "Related Applications" section)
Please correct to read:
--The present application claims priority from U.S. Provisional Patent Application Serial No. 60/636,590, filed December 16, 2004, entitled IMPROVING RETURN LOSS IN CONNECTORS BY CONDUCTOR SELF-COUPLING, and from U.S. Patent Application Serial No. 11/051,285, filed February 4, 2005, entitled COMMUNICATION JACK WITH PRINTED WIRING BOARD HAVING SELF-COUPLING CONDUCTOR, the disclosure of each of which is hereby incorporated herein in its entirety.--

In the Claims:

Column 11, Claim 24, Line 3: Please correct "The connector of claim 16,"
To read --The connector of claim 23,--

Signed and Sealed this

Fifteenth Day of January, 2008

JON W. DUDAS
*Director of the United States Patent and Trademark Office*